United States Patent
Feng et al.

(10) Patent No.: US 12,446,385 B2
(45) Date of Patent: Oct. 14, 2025

(54) MONOLITHIC RGB MICROLED ARRAY

(71) Applicant: Snap Inc., Santa Monica, CA (US)

(72) Inventors: Peng Feng, Sheffield (GB); Jack Haggar, Sheffield (GB); Kean Boon Lee, Sheffield (GB); Nicolas Poyiatzis, Sheffield (GB); Ye Tian, Sheffield (GB); Xiang Yu, Sheffield (GB)

(73) Assignee: Snap Inc., Santa Monica, CA (US)

( * ) Notice: Subject to any disclaimer, the term of this patent is extended or adjusted under 35 U.S.C. 154(b) by 0 days.

(21) Appl. No.: 18/924,840

(22) Filed: Oct. 23, 2024

(65) Prior Publication Data
US 2025/0151495 A1    May 8, 2025

Related U.S. Application Data

(60) Provisional application No. 63/596,174, filed on Nov. 3, 2023.

(51) Int. Cl.
*H10H 29/10* (2025.01)
*H10H 20/01* (2025.01)
(Continued)

(52) U.S. Cl.
CPC ........ *H10H 29/10* (2025.01); *H10H 20/0137* (2025.01); *H10H 20/812* (2025.01);
(Continued)

(58) Field of Classification Search
CPC .. H10H 29/10; H10H 20/821; H10H 20/0137; H10H 20/835; H10H 20/825;
(Continued)

(56) References Cited

U.S. PATENT DOCUMENTS

| 6,342,404 B1 | 1/2002 | Shibata et al. |
| 10,707,374 B2 | 7/2020 | Danesh et al. |

(Continued)

FOREIGN PATENT DOCUMENTS

| CN | 1316782 A | 10/2001 |
| CN | 1419301 A | 5/2003 |

(Continued)

OTHER PUBLICATIONS

"U.S. Appl. No. 17/250,997, Examiner Interview Summary mailed Jan. 12, 2024", 2 pgs.

(Continued)

*Primary Examiner* — Mark W Tornow
(74) *Attorney, Agent, or Firm* — Schwegman Lundberg & Woessner, P.A.

(57) ABSTRACT

A light emitting diode (LED) pixel array and method of fabrication thereof. A semiconductor wafer template includes a successively stacked lower n-GaN layer, lower MQW layer, lower p-GaN layer, upper n-GaN layer, and dielectric layer. A plurality of apertures is formed through the dielectric layer, extending to the upper n-GaN layer. A plurality of mesas is formed by forming, within each aperture, a mesa n-GaN layer, a mesa MQW layer above each mesa n-GaN layer, and a mesa p-GaN layer above each mesa MQW layer. The mesa n-GaN layer, mesa MQW layer, and mesa p-GaN layer of each mesa form a respective mesa LED. The lower n-GaN layer, lower MQW layer, and lower p-GaN layer form a lower LED.

16 Claims, 13 Drawing Sheets

(51) Int. Cl.
  *H10H 20/812* (2025.01)
  *H10H 20/821* (2025.01)
  *H10H 20/825* (2025.01)
  *H10H 20/832* (2025.01)
  *H10H 20/833* (2025.01)

(52) U.S. Cl.
  CPC ........ *H10H 20/821* (2025.01); *H10H 20/825* (2025.01); *H10H 20/833* (2025.01); *H10H 20/835* (2025.01); *H10H 20/032* (2025.01)

(58) Field of Classification Search
  CPC ... H10H 20/833; H10H 20/812; H10H 20/032
  See application file for complete search history.

(56) References Cited

U.S. PATENT DOCUMENTS

| | | | |
|---|---|---|---|
| 11,374,147 | B2 | 6/2022 | Charles |
| 11,569,446 | B2 | 1/2023 | Myoung et al. |
| 2003/0087462 | A1 | 5/2003 | Koide et al. |
| 2003/0107047 | A1 | 6/2003 | Okuyama et al. |
| 2006/0244002 | A1 | 11/2006 | Hooper et al. |
| 2007/0257264 | A1 | 11/2007 | Hersee et al. |
| 2010/0140629 | A1 | 6/2010 | Lee et al. |
| 2012/0061641 | A1 | 3/2012 | Seong et al. |
| 2014/0166974 | A1 | 6/2014 | Yoo et al. |
| 2014/0203293 | A1 | 7/2014 | Hwang et al. |
| 2014/0209859 | A1 | 7/2014 | Cha et al. |
| 2014/0246647 | A1 | 9/2014 | Cha et al. |
| 2014/0363912 | A1 | 12/2014 | Ohlsson et al. |
| 2015/0137072 | A1 | 5/2015 | Lee et al. |
| 2016/0056336 | A1 | 2/2016 | Hwang et al. |
| 2016/0064607 | A1 | 3/2016 | Yoo et al. |
| 2016/0126702 | A1 | 5/2016 | Ristic et al. |
| 2017/0005242 | A1 | 1/2017 | Kim et al. |
| 2017/0237234 | A1 | 8/2017 | Han et al. |
| 2018/0076363 | A1 | 3/2018 | Schubert et al. |
| 2019/0123235 | A1 | 4/2019 | Cho et al. |
| 2019/0355703 | A1 | 11/2019 | Hikmet et al. |
| 2019/0355868 | A1 | 11/2019 | Fimland et al. |
| 2021/0249467 | A1 | 8/2021 | He |
| 2021/0313497 | A1 | 10/2021 | Pourquier |
| 2021/0335884 | A1* | 10/2021 | Wang .................. H10H 29/142 |
| 2022/0037393 | A1* | 2/2022 | Robin .................. H10H 29/142 |
| 2022/0131041 | A1 | 4/2022 | Thompson et al. |
| 2022/0262848 | A1 | 8/2022 | Wang |
| 2022/0278165 | A1 | 9/2022 | Wang |
| 2023/0051845 | A1* | 2/2023 | Zollner .................. H10H 29/14 |
| 2023/0307579 | A1* | 9/2023 | Li ........................ H10H 29/142 |
| 2023/0335576 | A1 | 10/2023 | Zhang |
| 2023/0420627 | A1* | 12/2023 | Armitage ................ H10H 20/01 |
| 2024/0063333 | A1* | 2/2024 | Hansen ................ H10H 20/813 |
| 2025/0022910 | A1 | 1/2025 | Wang |
| 2025/0089429 | A1 | 3/2025 | Wang |
| 2025/0151458 | A1 | 5/2025 | Feng et al. |
| 2025/0151494 | A1 | 5/2025 | Feng et al. |

FOREIGN PATENT DOCUMENTS

| | | |
|---|---|---|
| CN | 102187477 A | 9/2011 |
| CN | 102709410 A | 10/2012 |
| CN | 103098216 A | 5/2013 |
| CN | 105009307 A | 10/2015 |
| CN | 107833878 A | 3/2018 |
| CN | 111864024 A | 10/2020 |
| CN | 112823421 A | 5/2021 |
| CN | 114424350 A | 4/2022 |
| CN | 114521296 A | 5/2022 |
| EP | 3864699 A1 | 8/2021 |
| EP | 4000093 A1 | 5/2022 |
| EP | 4000106 A1 | 5/2022 |
| JP | 2002026387 A | 1/2002 |
| JP | 2003505857 A | 2/2003 |
| JP | 2007027298 A | 2/2007 |
| JP | 2007035936 A | 2/2007 |
| JP | 2009071220 A | 4/2009 |
| JP | 2010512017 A | 4/2010 |
| JP | 2010135859 A | 6/2010 |
| JP | 2011258631 A | 12/2011 |
| JP | 2016527706 A | 9/2016 |
| JP | 2018502436 A | 1/2018 |
| JP | 2019012744 A | 1/2019 |
| JP | 2020513167 A | 4/2020 |
| JP | 2022504524 A | 1/2022 |
| JP | 2022541557 A | 9/2022 |
| JP | 7407181 B2 | 12/2023 |
| JP | 7438323 B2 | 2/2024 |
| JP | 7504983 B2 | 6/2024 |
| JP | 7617236 B2 | 1/2025 |
| JP | 7683060 B2 | 5/2025 |
| KR | 20040092673 A | 11/2004 |
| KR | 20140096970 A | 8/2014 |
| KR | 101721846 B1 | 4/2017 |
| KR | 20170074296 A | 6/2017 |
| KR | 20210069101 A | 6/2021 |
| KR | 102572630 B1 | 8/2023 |
| KR | 102790443 B1 | 3/2025 |
| WO | WO-0207232 A1 | 4/2002 |
| WO | WO-2011162715 A1 | 12/2011 |
| WO | WO-2012059837 A1 | 5/2012 |
| WO | WO-2016049507 A1 | 3/2016 |
| WO | WO-2016054232 A1 | 4/2016 |
| WO | WO-2018057041 A1 | 3/2018 |
| WO | WO-2019002786 A1 | 1/2019 |
| WO | WO-2019063957 A1 | 4/2019 |
| WO | WO-2020074875 A1 | 4/2020 |
| WO | WO-2021013641 A1 | 1/2021 |
| WO | WO-2021013642 A1 | 1/2021 |
| WO | WO-2021133530 A1 | 7/2021 |
| WO | WO-2022263756 A1 | 12/2022 |
| WO | WO-2025096622 A1 | 5/2025 |
| WO | WO-2025096639 A1 | 5/2025 |
| WO | WO-2025096790 A1 | 5/2025 |

OTHER PUBLICATIONS

"U.S. Appl. No. 17/250,997, Final Office Action mailed Jun. 5, 2024", 19 pgs.

"U.S. Appl. No. 17/250,997, Non Final Office Action mailed Feb. 23, 2024", 15 pgs.

"U.S. Appl. No. 17/250,997, Preliminary Amendment filed Aug. 6, 2021", 6 pgs.

"U.S. Appl. No. 17/250,997, Response filed Jan. 10, 2024 to Restriction Requirement mailed Nov. 14, 2023", 6 pgs.

"U.S. Appl. No. 17/250,997, Response filed May 22, 2024 to Non Final Office Action mailed Feb. 23, 2024", 10 pgs.

"U.S. Appl. No. 17/250,997, Restriction Requirement mailed Nov. 14, 2023", 7 pgs.

"U.S. Appl. No. 17/597,698, Examiner Interview Summary mailed Nov. 1, 2024", 2 pgs.

"U.S. Appl. No. 17/597,698, Non Final Office Action mailed Aug. 12, 2024", 9 pgs.

"U.S. Appl. No. 17/597,698, Notice of Allowance mailed Jan. 29, 2025", 10 pgs.

"U.S. Appl. No. 17/597,698, Response filed Jun. 17, 2024 to Restriction Requirement mailed Apr. 26, 2024", 7 pgs.

"U.S. Appl. No. 17/597,698, Response filed Nov. 12, 2024 to Non Final Office Action mailed Aug. 12, 2024", 9 pgs.

"U.S. Appl. No. 17/597,698, Restriction Requirement mailed Apr. 26, 2024", 8 pgs.

"U.S. Appl. No. 17/597,699, 312 Amendment filed Nov. 22, 2024", 3 pgs.

"U.S. Appl. No. 17/597,699, Corrected Notice of Allowability mailed Sep. 3, 2024", 2 pgs.

"U.S. Appl. No. 17/597,699, Corrected Notice of Allowability mailed Nov. 27, 2024", 2 pgs.

"U.S. Appl. No. 17/597,699, Corrected Notice of Allowability mailed Dec. 2, 2024", 3 pgs.

"U.S. Appl. No. 17/597,699, Examiner Interview Summary mailed Jul. 16, 2024", 2 pgs.

(56) References Cited

OTHER PUBLICATIONS

"U.S. Appl. No. 17/597,699, Non Final Office Action mailed May 6, 2024", 16 pgs.
"U.S. Appl. No. 17/597,699, Notice of Allowance mailed Aug. 26, 2024", 12 pgs.
"U.S. Appl. No. 17/597,699, Preliminary Amendment filed Jul. 5, 2022", 5 pgs.
"U.S. Appl. No. 17/597,699, Response filed Jul. 16, 2024 to Non Final Office Action mailed May 6, 2024", 11 pgs.
"Chinese Application Serial No. 201980066550.4, Office Action mailed Apr. 10, 2024", w/ English translation, 19 pgs.
"Chinese Application Serial No. 201980066550.4, Office Action mailed Oct. 15, 2024", w/ English Translation, 14 pgs.
"Chinese Application Serial No. 201980066550.4, Response filed Aug. 9, 2024 to Office Action mailed Apr. 10, 2024", w/ English claims, 11 pgs.
"Chinese Application Serial No. 201980066550.4, Response filed Dec. 13, 2024 to Office Action mailed Oct. 15, 2024", w/ current English claims, 10 pgs.
"Chinese Application Serial No. 202080066179.4, Office Action mailed Nov. 15, 2024", w/ English translation, 14 pgs.
"Chinese Application Serial No. 202080067170.5, Office Action mailed Oct. 21, 2024", w/ English translation, 16 pgs.
"Chinese Application Serial No. 202080067170.5, Response filed Feb. 11, 2025 to Office Action mailed Oct. 21, 2024", w/ English Claims, 11 pgs.
"European Application Serial No. 19787394.6, Indication of deficiencies in a request under Rule 22 EPC mailed Apr. 3, 2023", 2 pgs.
"European Application Serial No. 19787394.6, Response to Communication pursuant to Rules 161(1) and 162 EPC filed Nov. 29, 2021", 14 pgs.
"European Application Serial No. 20753677.2, Indication of deficiencies in a request under Rule 22 EPC mailed Apr. 3, 2023", 2 pgs.
"European Application Serial No. 20753678.0, Indication of deficiencies in a request under Rule 22 EPC mailed Apr. 3, 2023", 2 pgs.
"European Application Serial No. 20753678.0, Response to Communication pursuant to Rules 161 and 162 filed Sep. 8, 2022", 12 pgs.
"Indian Application Serial No. 202217005916, First Examination Report mailed Jul. 19, 2023", 7 pgs.
"Indian Application Serial No. 202217005916, Response filed Jan. 11, 2024 to First Examination Report mailed Jul. 19, 2023", w/ English Claims, 26 pgs.
"Indian Application Serial No. 202217005917, First Examination Report mailed Nov. 1, 2023", 5 pgs.
"Indian Application Serial No. 202217005917, Response filed Apr. 23, 2024 to First Examination Report mailed Nov. 1, 2023", 4 pgs.
"International Application Serial No. PCT/EP2020/069911, International Search Report mailed Oct. 22, 2020", 4 pgs.
"International Application Serial No. PCT/EP2020/069911, Written Opinion mailed Oct. 22, 2020", 6 pgs.
"International Application Serial No. PCT/EP2020/069917, International Preliminary Report on Patentability mailed Feb. 3, 2022", 7 pgs.
"International Application Serial No. PCT/EP2020/069917, International Search Report mailed Nov. 12, 2020", 3 pgs.
"International Application Serial No. PCT/EP2020/069917, Written Opinion mailed Nov. 12, 2020", 5 pgs.
"International Application Serial No. PCT/GB2019/052843, International Preliminary Report on Patentability mailed Apr. 22, 2021", 7 pgs.
"International Application Serial No. PCT/GB2019/052843, International Search Report mailed Jan. 7, 2020", 3 pgs.
"International Application Serial No. PCT/GB2019/052843, Written Opinion mailed Jan. 7, 2020", 5 pgs.
"International Application Serial No. PCT/US2024/053676, International Search Report mailed Feb. 12, 2025", 3 pgs.
"International Application Serial No. PCT/US2024/053676, Written Opinion mailed Feb. 12, 2025", 3 pgs.
"International Application Serial No. PCT/US2024/053698, International Search Report mailed Feb. 4, 2025", 4 pgs.
"International Application Serial No. PCT/US2024/053698, Written Opinion mailed Feb. 4, 2025", 4 pgs.
"International Application Serial No. PCT/US2024/053906, International Search Report mailed Feb. 11, 2025", 4 pgs.
"International Application Serial No. PCT/US2024/053906, Written Opinion mailed Feb. 11, 2025", 6 pgs.
"Japanese Application Serial No. 2021-519576, Notification of Reasons for Refusal mailed May 23, 2023", w/ English Translation, 7 pgs.
"Japanese Application Serial No. 2022-503481, Final Notification of Reasons for Refusal mailed Jan. 22, 2024", w/ English Translation, 4 pgs.
"Japanese Application Serial No. 2022-503481, Notification of Reasons for Refusal mailed Oct. 2, 2023", w/ English Translation, 6 pgs.
"Japanese Application Serial No. 2022-503481, Response filed Mar. 25, 2024 to Final Notification of Reasons for Refusal mailed Jan. 22, 2024", w/ English claims, 9 pgs.
"Japanese Application Serial No. 2022-503481, Response Filed Dec. 27, 2023 to Notification of Reasons for Refusal mailed Oct. 2, 2023", w/ English Claims, 16 pgs.
"Japanese Application Serial No. 2022-503482, Notification of Reasons for Refusal mailed Oct. 3, 2023", w/ English Translation, 7 pgs.
"Japanese Application Serial No. 2022-503482, Response Filed Dec. 26, 2023 to Notification of Reasons for Refusal mailed Oct. 3, 2023", w/ English Claims, 14 pgs.
"Japanese Application Serial No. 2023-212818, Notification of Reasons for Rejection mailed Jul. 10, 2024", W/English Translation, 7 pgs.
"Japanese Application Serial No. 2023-212818, Response filed Oct. 10, 2024 to Notification of Reasons for Rejection mailed Jul. 10, 2024", w/ English claims, 13 pgs.
"Japanese Application Serial No. 2024-019309, Notification of Reasons for Refusal mailed Jan. 8, 2025", w/ English translation, 9 pgs.
"Korean Application Serial No. 10-2021-7013348, Notice of Preliminary Rejection mailed Jul. 1, 2024", w/ English translation, 13 pgs.
"Korean Application Serial No. 10-2021-7013348, Notice of Preliminary Rejection mailed Oct. 21, 2024", w/ English translation, 7 pgs.
"Korean Application Serial No. 10-2021-7013348, Response filed Aug. 8, 2024 to Notice of Preliminary Rejection mailed Jul. 1, 2024", W/English Claims, 15 pgs.
"Korean Application Serial No. 10-2021-7013348, Response filed Nov. 18, 2024 to Notice of Preliminary Rejection mailed Oct. 21, 2024", w/ English Claims, 12 pgs.
"United Kingdom Application Serial No. 1816455.8, Combined Search and Examination Report mailed Mar. 6, 2019", 6 pgs.
"United Kingdom Application Serial No. 1910352.2, Combined Search and Examination Report mailed Jan. 20, 2020", 16 pgs.
Day, Jacob, et al., "III-Nitride full-scale high-resolution microdisplays", Applied Physics Letters 99, 031116, doi:10.1063/1.3615679, (2011), 3 pgs.
Fan, ZY, et al., "III-nitride micro-emitter arrays: development and applications", J. Phys. D: Appl. Phys. 41: 094001, doi: 10.1088/0022-3727/41/9/094001, (2008), 13 pgs.
Hou, Y., et al., "Porosity-enhanced solar powered hydrogen generation in GaN photoelectrodes", Applied Physics Letters 111, 203901, https://doi.org/10.1063/1.5001938, (2017), 6 pgs.
Jiang, H.X., et al., "Nitride micro-LEDs and beyond—a decade progress review", Optics Express, vol. 21, No. S3, A4755, DOI: 10.1364/OE.21.00A475, (2013), 10 pgs.
Lee, Vincent W, et al., "Micro-LED Technologies and Applications", Information Display 6/16, (2016), 16-23.
Li, K.H., et al., "Confocal microscopic analysis of optical crosstalk in GaN micro-pixel light-emitting diodes", Applied Physics Letters 107, 171103, (2015), 5 pgs.
Li, M Cheng, et al., "An Analytical Compact Direct-Current and Capacitance Model for AlGaN/GaN High Electron Mobility Tran-

(56) References Cited

OTHER PUBLICATIONS sistors", MRS Online Proceedings Library 1068, 10680317, [Online]. Retrieved from the Internet: <https://doi.org/10.1557/PROC-1068-C03-17>, (2007), 6 pgs.

Lin, Huang-Yu, et al., "Optical cross-talk reduction in a quantum-dot-based full-color micro-light-emitting-diode display by a lithographic-fabricated photoresist mold", Photonics Research, vol. 5, No. 5, (2017), 411-416.

Shiu, Guo-Yi, et al., "InGaN Light-Emitting Diodes with an Embedded Nanoporous GaN Distributed Bragg Reflectors", Scientific Reports vol. 6, 29138, [Online] Retrieved from the Internet: <URL: https://www.nature.com/articles/srep29138>, (Jul. 1, 2016), 8 pgs.

Sun, Cheng-Wei, et al., "71-1: Development of Micro-Pixellated GaN LED Array Micro-Display System", SID Digest of Technical Papers, (2011), 1042-1045.

Zhang, H. X., et al., "Individually-addressable flip-chip AlInGaN micropixelated light emitting diode arrays with high continuous and nanosecond output power", Optics Express, 16(13), (2008), 9918-9926.

Zhao, Jun Liu, et al., "360 PPI Flip-Chip Mounted Active Matrix Addressable Light Emitting Diode on Silicon (LEDoS) Micro-Displays", Journal of Display Technology, 9(8), (Aug. 2013), 678-682.

"U.S. Appl. No. 17/597,698, Corrected Notice of Allowability mailed May 12, 2025", 2 pgs.

"U.S. Appl. No. 17/597,698, Notice of Allowance mailed Apr. 25, 2025", 10 pgs.

"Chinese Application Serial No. 201980066550.4, Office Action mailed Feb. 24, 2025", W/English Translation, 8 pgs.

"Chinese Application Serial No. 201980066550.4, Response filed Apr. 14, 2025 to Office Action mailed Feb. 24, 2025", W/English Claims, 12 pgs.

"Chinese Application Serial No. 202080066179.4, Response filed Feb. 28, 2025 to Office Action mailed Nov. 15, 2024", w/ English Claims, 11 pgs.

"Chinese Application Serial No. 202080067170.5, Office Action mailed Mar. 3, 2025", w/ English translation, 13 pgs.

"Chinese Application Serial No. 202080067170.5, Response filed Apr. 23, 2025 to Office Action mailed Mar. 3, 2025", w/ English Claims, 9 pgs.

"European Application Serial No. 19787394.6, Communication Pursuant to Article 94(3) EPC mailed Mar. 10, 2025", 6 pgs.

"Japanese Application Serial No. 2024-019309, Response filed Mar. 27, 2025 to Notification of Reasons for Refusal mailed Jan. 8, 2025", w/ current English claims, 17 pgs.

"Japanese Application Serial No. 2024-094302, Notification of Reasons for Refusal mailed Apr. 9, 2025", w/ English Translation, 9 pgs.

\* cited by examiner

MONOLITHIC RGB MICROLED ARRAY

CLAIM OF PRIORITY

This application claims the benefit of priority to U.S. Provisional Application Ser. No. 63/596,174, filed on Nov. 3, 2023, which is incorporated herein by reference in its entirety.

TECHNICAL FIELD

The present disclosure relates generally to light emitting diode (LED) fabrication and more particularly to fabrication of monolithic red/green/blue microLED pixel arrays.

BACKGROUND

Group III-nitride LEDs, grown on a micrometer scale, are referred to as micro-sized LEDs or simply microLEDs, micro-LEDs, or µLEDs. Typically, the diameter of a µLED is 50 micrometers or less. µLEDs are expected to provide the basis for new generation displays and visible light communication (VLC) applications. III-nitride µLEDs exhibit a number of unique features for display applications compared with organic light-emitting diodes (OLEDs) and liquid crystal displays (LCDs). Unlike LCDs, III-nitride micro-displays using µLEDs are self-emissive. Monochromatic displays using µLEDs typically exhibit high resolution, high efficiency, and high contrast ratio. OLEDs are typically operated at a current density that is several orders of magnitude lower than semiconductor LEDs in order to maintain a reasonable lifetime. As a consequence, the luminance of OLEDs is low relative to III-nitride µLEDs. Furthermore, III-nitride µLEDs intrinsically exhibit long operation lifetime and chemical robustness in comparison with OLEDs. Therefore, it is expected that III-nitride µLEDs could potentially replace LCDs and OLEDs for high resolution and high brightness displays in a wide range of applications, such as smart phones, in the near future.

BRIEF DESCRIPTION OF THE SEVERAL VIEWS OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some non-limiting examples are illustrated in the figures of the accompanying drawings in which.

DETAILED DESCRIPTION

Figure 1:
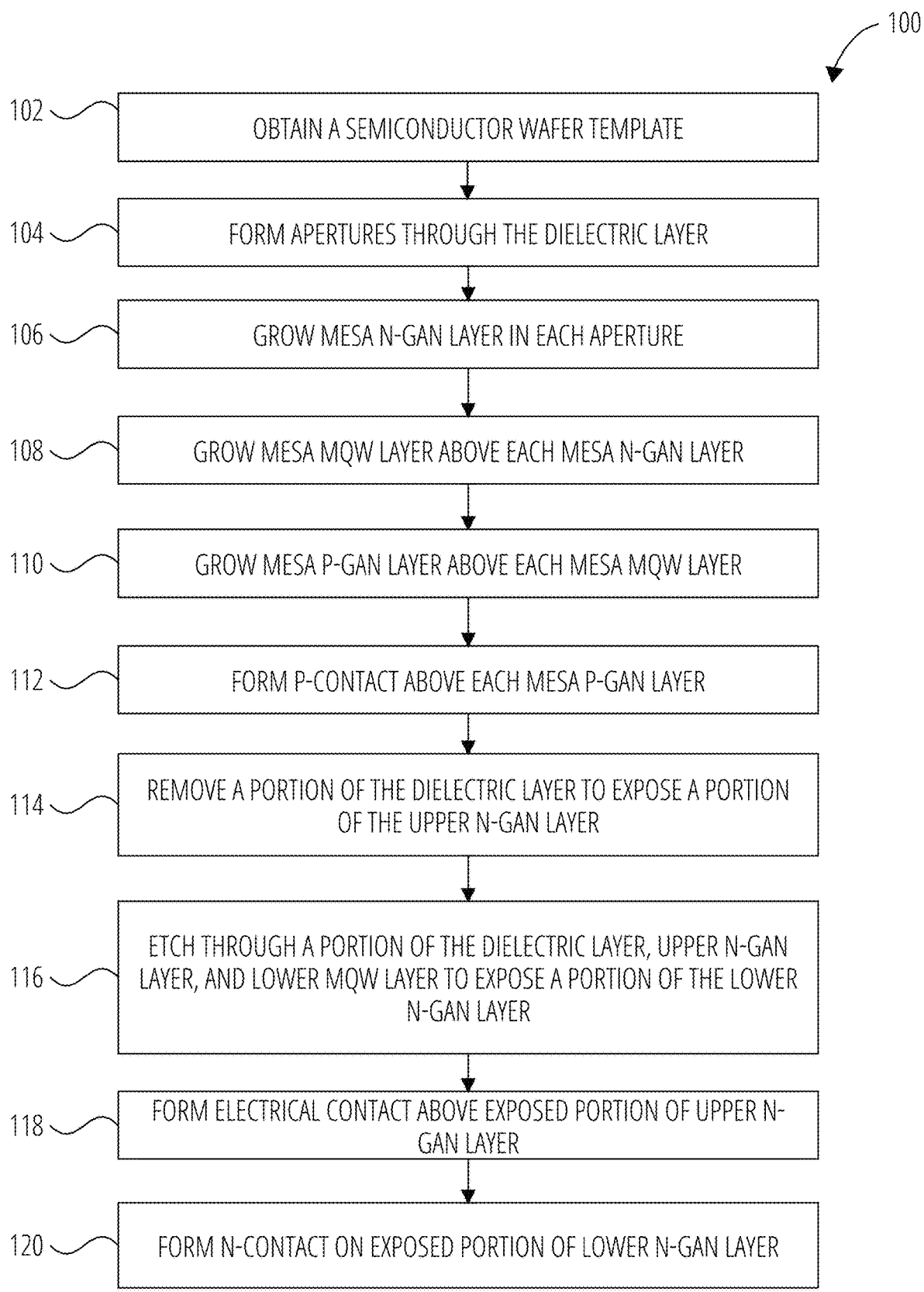
FIG. 1 illustrates operations of an example method for fabricating an LED pixel array, according to some examples.

Examples of the present disclosure provide monolithic red-green-blue (RGB) LED pixels, LED pixel arrays, and methods for fabrication thereof. In some examples, an LED pixel structure (such as a microLED pixel structure) may be fabricated from a semiconductor wafer template to include a first multiple quantum well (MQW) layer, as well as one or more mesas formed above the lower MQW layer. The lower MQW layer may be configured as part of an LED to emit a single color of light, such as blue light, or the LED may be configured to be tunable between two colors of light, such as a tunable blue/green LED. Each mesa provides an additional LED, such as a red LED, or a tunable red/green LED. The LED pixel structure may be formed through epitaxy and etching techniques at a wafer scale, thereby forming an array of LED pixel structures.

Accordingly, some examples described herein attempt to address one or more technical problems of microLED fabrication. By using epitaxial growth to fabricate an array of monolithic polychromatic microLEDs at wafer scale, some examples may avoid the need to stack and bond multiple wafers. In addition, some examples may avoid the damage to microLED sidewalls typically caused by etching in conventional microLED fabrication approaches, thereby potentially improving the performance of the LEDs.

As used herein, the "color" of an LED, multiple quantum well stack, or other light-emitting component may refer to a dominant or central wavelength of the light emitted by the component. The wavelengths of light emitted by a given LED can be controlled using various techniques, such as controlling the size of the LED and/or the structure, material composition, and/or size of the multiple quantum well stack of the LED.

Some examples described herein may use tunable multi-color LEDs, such as red/green LEDs or blue/green LEDs. Tunable multi-color LEDs can be fabricated using various techniques: for example, bluish-green light emissions from a blue/green LED, or reddish-green emissions from a red/green LED, can be achieved by exploiting the blueshift phenomenon, caused by the band-filling effect and the piezoelectric screening effect. In examples using a III-nitride LED, this blueshift phenomenon is unavoidable, but can be reduced by optimizing the LED epitaxy structure. For example, more quantum well (QW) layers can be grown to reduce the carrier density among each QW, V-pits can be formed on the MQW surface to increase the uniformity of current injection to each QW, and/or strain on the MQW can be reduced to reduce the piezoelectrical field. However, tunable LEDs described herein can exploit the blueshift phenomenon to enable modulation of the wavelength of the emitted light by modulating current injection, such that an increase in the injected current shifts the light wavelength toward shorter (bluer) wavelengths.

As used herein, terms such as "above", "below", "upper", "lower", and other relative vertical positions are intended in this disclosure to refer to the relative positions of various features with respect to a frame of reference in which a surface normal to a substrate surface used in semiconductor fabrication, such as a crystalline substrate surface, defines an upward direction. It will be appreciated that the portions of a fabricated semiconductor device farther from the substrate surface are referred to as "above" those portions closer to the substrate surface, even though the semiconductor device may be fabricated in contact with the substrate surface at any orientation relative to the Earth's gravitational field or any other frame of reference, and even though the semiconductor device may be used in any orientation after fabrication.

Other technical features and/or benefits may be readily apparent to one skilled in the art from the following figures, descriptions, and claims.

FIG. 1 illustrates an example method 100 for fabricating an LED pixel array. Although the example method 100 depicts a particular sequence of operations, the sequence may be altered without departing from the scope of the present disclosure. For example, some of the operations depicted may be performed in parallel or in a different sequence that does not materially affect the function of the method 100. In other examples, different components of an example device or system that implements the method 100 may perform functions at substantially the same time or in a specific sequence.

The example method 100 is described with reference to the fabrication of an example LED pixel structure, such as the pixel structure 1200 described below with reference to FIG. 12. It will be appreciated that, in other examples, the method 100 can be performed to fabricate devices having different structures or different characteristics from the example pixels and pixel arrays described herein. In some examples, the operations of method 100 may be performed at wafer scale to form a microLED pixel array, such that thousands or millions of LED pixel structures are formed within the wafer simultaneously. Epitaxial growth or overgrowth operations and other deposition operations may be performed using wafer-scale deposition techniques such as metal organic chemical vapor deposition (MOCVD), and selective etching operations may be performed using photolithography in combination with wet or dry etching at wafer scale or at least multi-pixel scale. In some examples, the semiconductor materials used in the method 100 include p-type and n-type gallium nitride (p-GaN and n-GaN) materials, and only wet etching may be used in etching operations contacting p-GaN material or MQW stacks, so as to prevent damage to the p-GaN structure caused by dry etching.

The example method 100 is described below with reference to example LED pixel array fabrication operations performed on a first example semiconductor wafer template 200, described below with reference to FIG. 2 through FIG. 12. It will be appreciated that, in other examples, the method 100 can be performed using operations that differ from the example operations and structures as illustrated and described.

According to some examples, the method 100 includes obtaining a semiconductor wafer template at operation 102. An example semiconductor wafer template is described below with reference to FIG. 2. In some examples, operation 102 includes a sequence of sub-operations for fabricating the semiconductor wafer template 200, described below with reference to FIG. 3.

Figure 2:
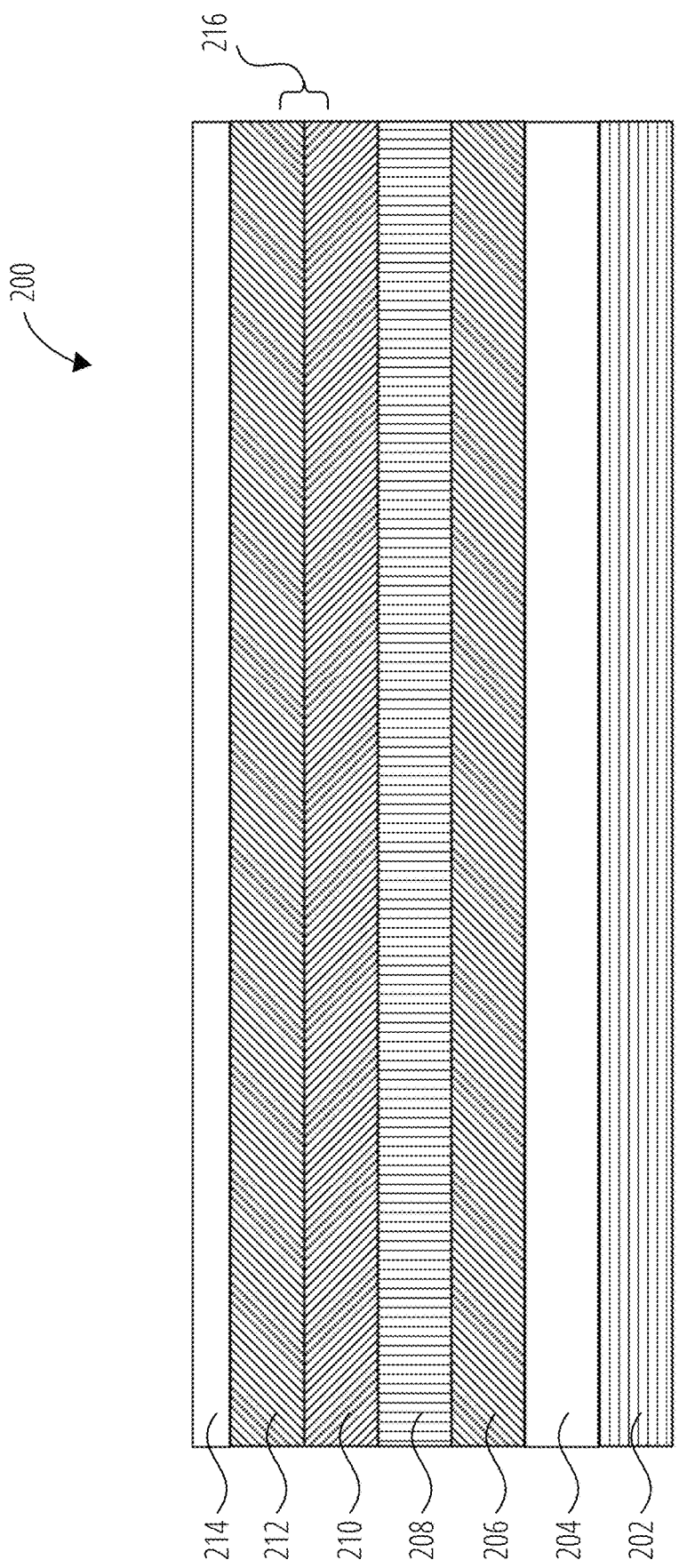
FIG. 2 illustrates a cross-sectional view of a first example semiconductor wafer template, according to some examples.

FIG. 2 shows a cross-sectional view of a first example semiconductor wafer template 200. In some examples, the semiconductor wafer template 200 is obtained in a pre-fabricated form, as a laminated structure of successively stacked layers: the lower n-GaN layer 206, the lower MQW layer 208, the lower p-GaN layer 210, and the dielectric layer 214. In some examples, the semiconductor wafer template 200 is formed (or further formed) through the sequence of one or more of the sub-operations of operation 102 described below with reference to FIG. 3.

Figure 3:
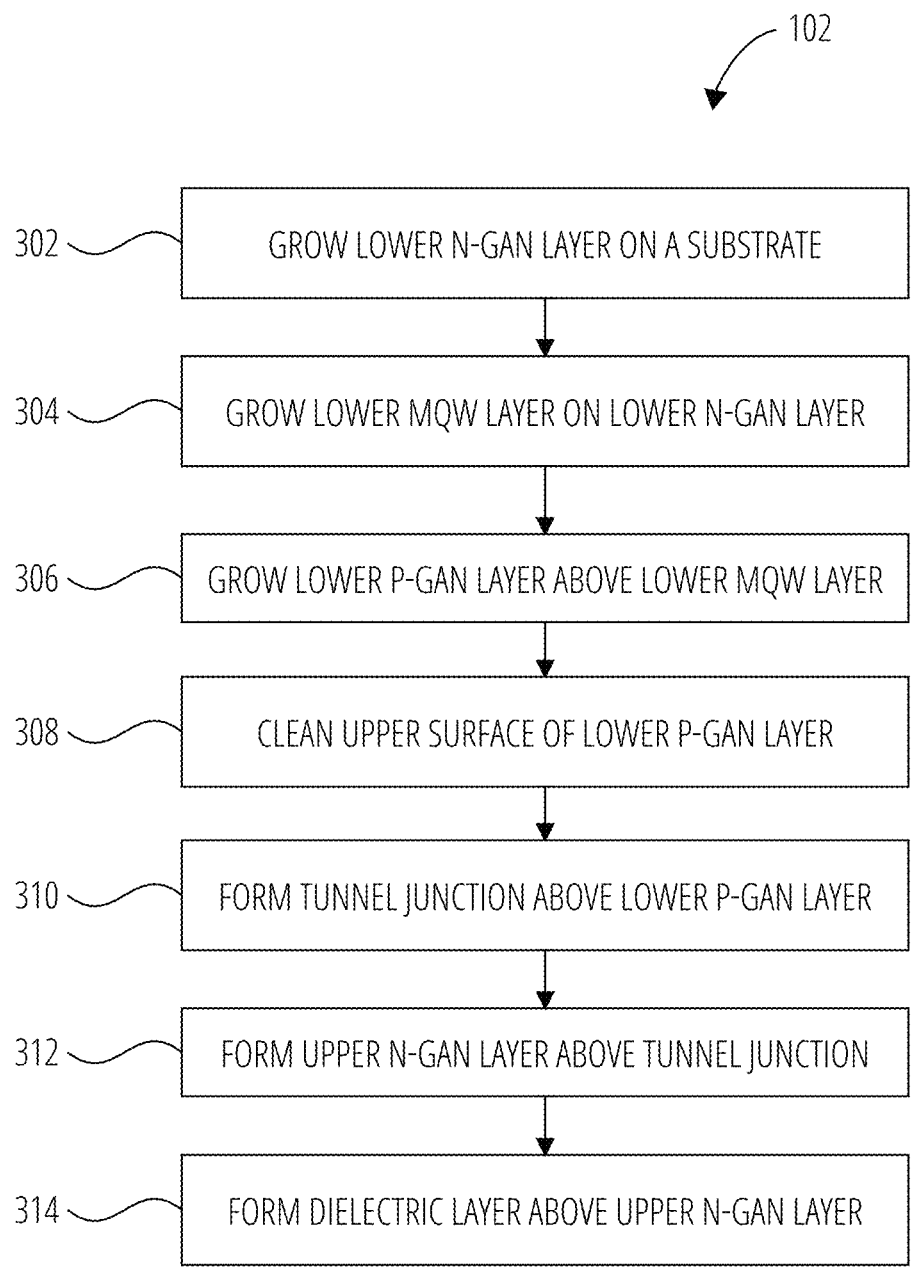
FIG. 3 illustrates sub-operations of an example operation of the method of FIG. 1 for obtaining a semiconductor wafer template, according to some examples.

FIG. 3 illustrates sub-operations of an example of operation 102 of method 100. Although the flowchart of FIG. 3 depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

According to some examples, operation 102 includes growing a lower n-GaN layer 206 on a substrate at sub-operation 302. In some examples, the substrate is a substrate layer 202 suitable for semiconductor growth. In some examples, the substrate also includes a buffer, such as an undoped gallium nitride layer (shown as u-GaN buffer layer 204), grown above the substrate layer 202.

According to some examples, operation 102 includes growing a lower MQW layer 208 on the lower n-GaN layer 206 at sub-operation 304. In some examples, the lower MQW layer 208 is a multiple quantum well stack optimized or configured to emit light of a single specific color, such as a blue MQW layer configured to emit blue light. In some examples, the lower MQW layer 208 is a tunable multiple quantum well stack configured to be tunable between two colors of light emission, such as a blue/green MQW layer configured to be tunable between blue light and green light.

According to some examples, operation 102 includes growing a lower p-GaN layer 210 above the lower MQW layer 208 at sub-operation 306. The lower p-GaN layer 210, lower MQW layer 208, and lower n-GaN layer 206 jointly form a first LED, such as a blue LED or tunable blue-green LED, when stimulated by an electrical signal delivered via p-contacts formed on the lower p-GaN layer 210 and n-contacts formed on the lower n-GaN layer 206, as described below with reference to FIG. 12.

According to some examples, operation 102 optionally includes cleaning an upper surface of the lower p-GaN layer 210 at sub-operation 308. Growing an n-GaN layer (such as upper n-GaN layer 212) over the lower p-GaN layer 210 may present challenges in some cases. If the semiconductor wafer template 200 is formed in the same growth chamber used for operation 106, it may be necessary to perform surface cleaning of the top surface of the lower p-GaN layer 210 prior to further n-type semiconductor overgrowth above the lower p-GaN layer 210. The surface cleaning removes magnesium and/or other p-type surface dopants used in the p-GaN growth process, which present a risk of contaminating a subsequent n-GaN layer (e.g., upper n-GaN layer 212), thereby resulting in a vertical doping gradient within the n-GaN layer from p-type doping to n-type doping as the magnesium depletes during the n-type growth process (e.g., sub-operation 312 described below). In some examples, operation 308 may be omitted; depending on the technology used for wafer fabrication, the tunnel junction 216 can be formed between the lower p-GaN layer 210 and the upper n-GaN layer 212 without performing the wafer surface cleaning operation 308.

According to some examples, operation 102 includes forming a tunnel junction 216 above the lower p-GaN layer 210 at sub-operation 310. In some examples, the tunnel junction 216 is a heavily doped positive-to-negative (P-N) junction. The thickness of the tunnel junction 216 may be approximately 10 nanometers (nm). The heavy doping results in a broken band gap, where conduction band electron states on the n-side (in this case, the upper n-GaN layer 212 described below) are more or less aligned with valence band hole states on the p-side (in this case, lower p-GaN layer 210). In some examples, the tunnel junction 216 may be formed from germanium, gallium arsenide, and/or a silicon material.

According to some examples, operation 102 includes forming an upper n-GaN layer 212 above the tunnel junction 216 at sub-operation 312. In some examples, operation 310 and operation 312 can be combined into a single operation in which n-GaN is grown above the lower P-GaN layer 210 to form the tunnel junction 216.

According to some examples, operation 102 includes forming a dielectric layer 214 above the upper n-GaN layer 212 at sub-operation 314. The dielectric layer 214 may be formed from a suitable dielectric material, such as an oxide, e.g., $SiO_2$.

Figure 4:
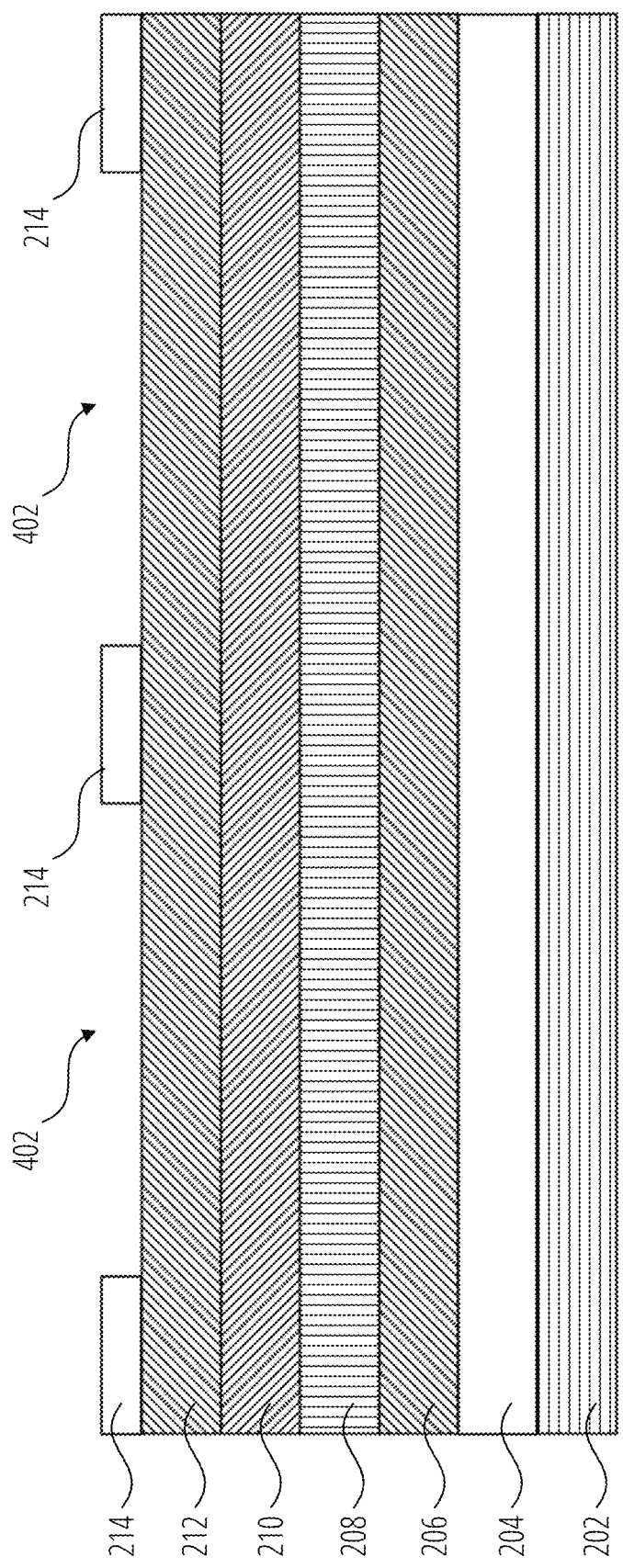
FIG. 4 illustrates a cross-sectional view of the semiconductor wafer template of FIG. 2 after a first LED pixel array fabrication operation, according to some examples.

According to some examples, the method 100 includes forming apertures 402 (as depicted in FIG. 4) through the dielectric layer 214 at operation 104. In some examples, the apertures 402 are formed through selective etching using photolithography.

FIG. 4 shows a cross-sectional view of the semiconductor wafer template 200 after operation 104. The apertures 402 may be formed through etching, such as wet etching, through the dielectric layer 214 to the upper n-GaN layer 212. In some examples, such as the illustrated example, two apertures 402 may be formed at operation 104 in order to form two mesas, as described below. However, it will be appreciated that the techniques described herein, with suitable modifications, may be suitable for LED pixel structures including one mesa or two or more mesas.

According to some examples, the method 100 includes growing a mesa n-GaN layer 504 in each aperture 402 at operation 106. In some examples, the mesa n-GaN layer 504 may be formed through selective MOCVD overgrowth.

Figure 5:
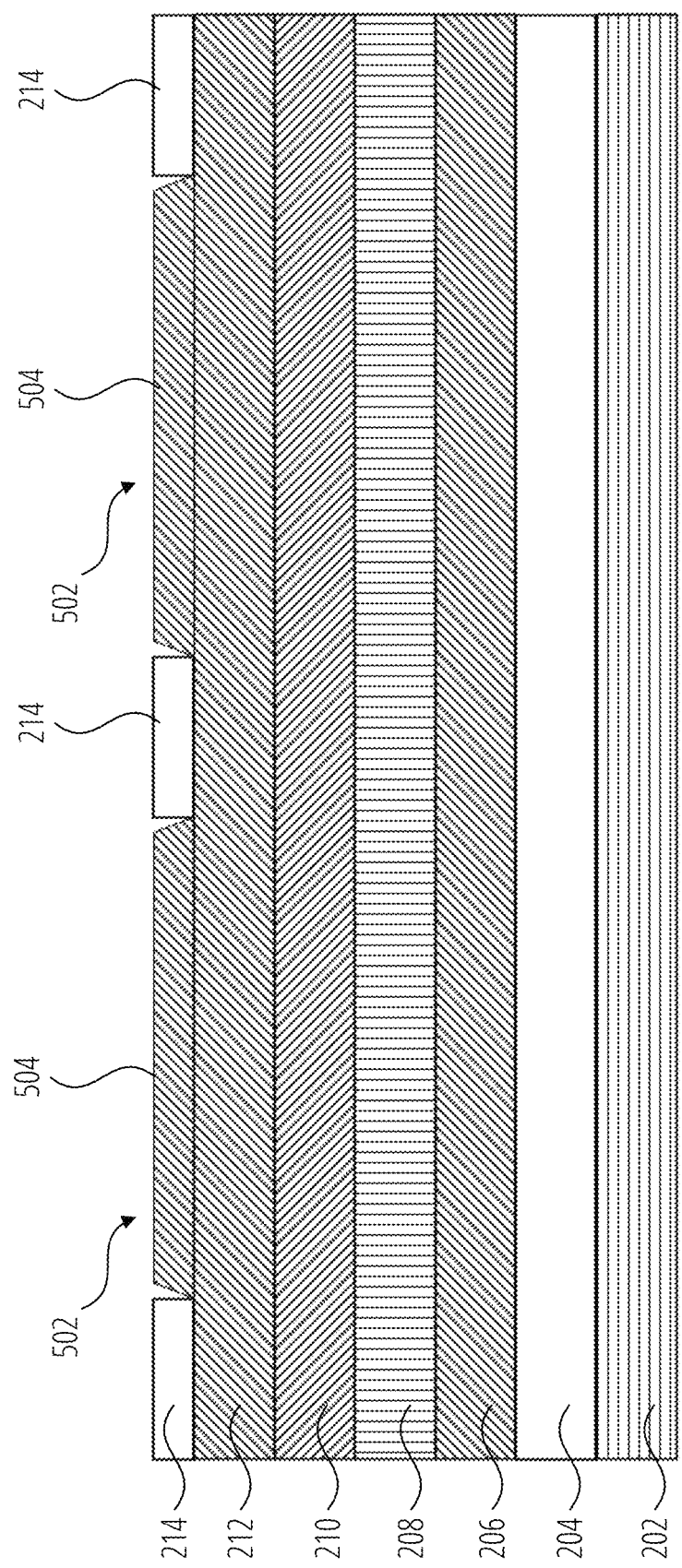
FIG. 5 illustrates a cross-sectional view of the semiconductor wafer template of FIG. 2 after a further LED pixel array fabrication operation, according to some examples.

FIG. 5 shows a cross-sectional view of the semiconductor wafer template 200 after operation 106. In the illustrated example, two mesa n-GaN layers 504 are grown in the two apertures 402 shown in FIG. 4. Each mesa n-GaN layer 504 forms a base of a mesa 502 within the aperture 402, and each mesa n-GaN layer 504 functionally serves as an extension of the upper n-GaN layer 212. The sidewalls of the mesa 502 may be formed as a semi-polar surface of the GaN material used to form the mesa n-GaN layer 504, as described below with reference to FIG. 6.

Figure 6:
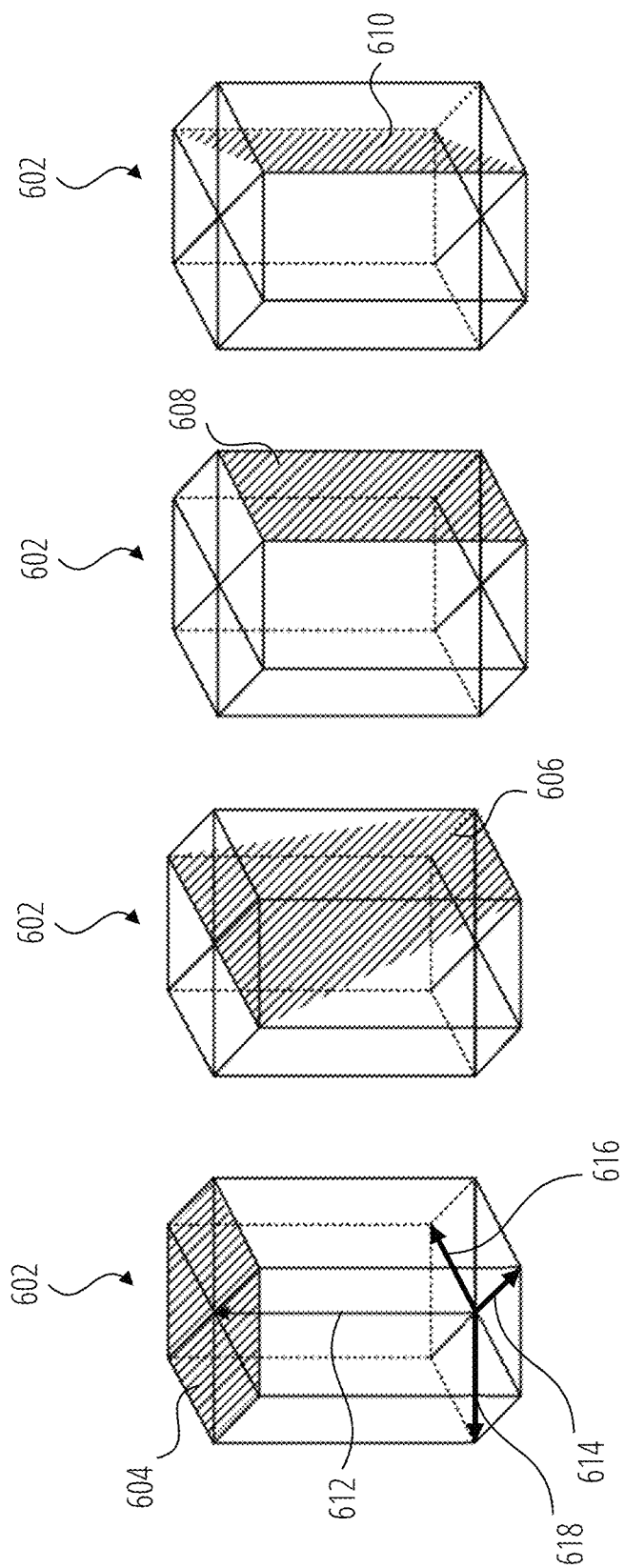
FIG. 6 illustrates four different orientations of surfaces formed through a hexagonal crystal structure, according to some examples.

FIG. 6 illustrates four different orientations of surfaces formed through a hexagonal crystal structure 602 of GaN material. The illustrated hexagonal crystal structure 602 characterizes GaN as well as various of its related ternary compounds such as indium gallium nitride (InGaN) and aluminum gallium nitride (AlGaN), all of which may be referred to herein as GaN materials.

The hexagonal crystal structure 602 of the GaN material defines several surface orientations that can be formed through the material. A polar (c-plane) surface 604, also referred to as the (0001) surface, defines a horizontal planar orientation normal to the c vector 612. A semi-polar surface 606, also referred to as the (10-11) surface, defines a diagonal planar orientation in which the plane intersects a top centerline of the hexagonal crystal structure 602 and one of the two bottom edges of the hexagonal crystal structure 602 parallel to the top centerline. A non-polar (m-plane) surface 608, also referred to as the (10-10) surface, defines a vertical planar orientation coplanar with one of the six sides of the hexagonal crystal structure 602. A non-polar (a-plane) surface 610, also referred to as the (11-20) surface, defines another vertical planar orientation extending from two nonadjacent top vertices of the hexagonal crystal structure 602 parallel to the c vector 612 contacting the two bottom vertex counterparts. The radial directions of the hexagonal crystal structure 602 are designated by the a1 vector 614, a2 vector 616, and a3 vector 618.

Thus, the sidewalls of the mesas 502 shown in FIG. 5 through FIG. 12 may be formed to extend diagonally from the mesa tops, at an angle defined by the semi-polar surface 606 of the hexagonal crystal structure 602 of the mesa n-GaN layer 504. Specifically, the semi-polar surface 606 is at a 62° angle to the horizontal (e.g., the upper surface of the upper n-GaN layer 212). Thus, in some examples, the sidewalls of the mesas 502 may be sloped at a 62° angle.

According to some examples, the method 100 includes growing a mesa MQW layer 702 (depicted in FIG. 7) over each mesa n-GaN layer 504 at operation 108. In some examples, the mesa MQW layer 702 may be formed through selective MOCVD overgrowth.

Figure 7:
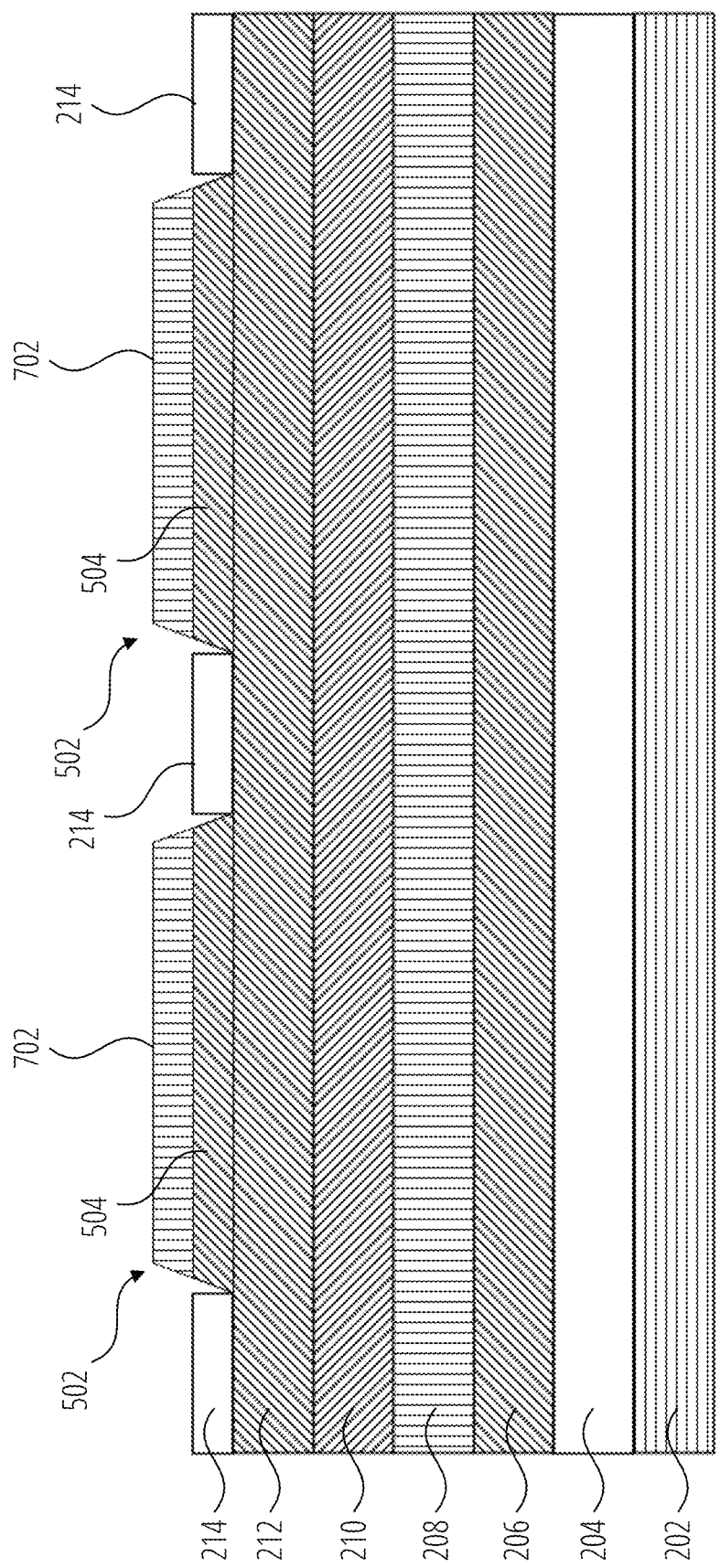
FIG. 7 illustrates a cross-sectional view of the semiconductor wafer template of FIG. 2 after a further LED pixel array fabrication operation, according to some examples.

FIG. 7 shows a cross-sectional view of the semiconductor wafer template 200 after operation 108. The mesa MQW layers 702 form a middle portion of each mesa 502. The sidewalls of each mesa 502 may continue to align with the semi-polar surface 606 of the material of the mesa MQW layer 702, e.g., at a 62° angle to the surface of the upper n-GaN layer 212.

In some examples, each of the two or more mesa MQW layers 702 are configured to emit the same color, so as to each form a red LED, or a tunable red/green LED. In other examples, the two or more mesa MQW layers 702 are differently configured: for example, one mesa MQW layer 702 may be configured to form a red LED, whereas the other mesa MQW layer 702 may be configured to form a green LED.

According to some examples, the method 100 includes growing a mesa p-GaN layer 802 over each mesa MQW layer 702 at operation 110. In some examples, the mesa p-GaN layer 802 may be formed through selective MOCVD overgrowth.

Figure 8:
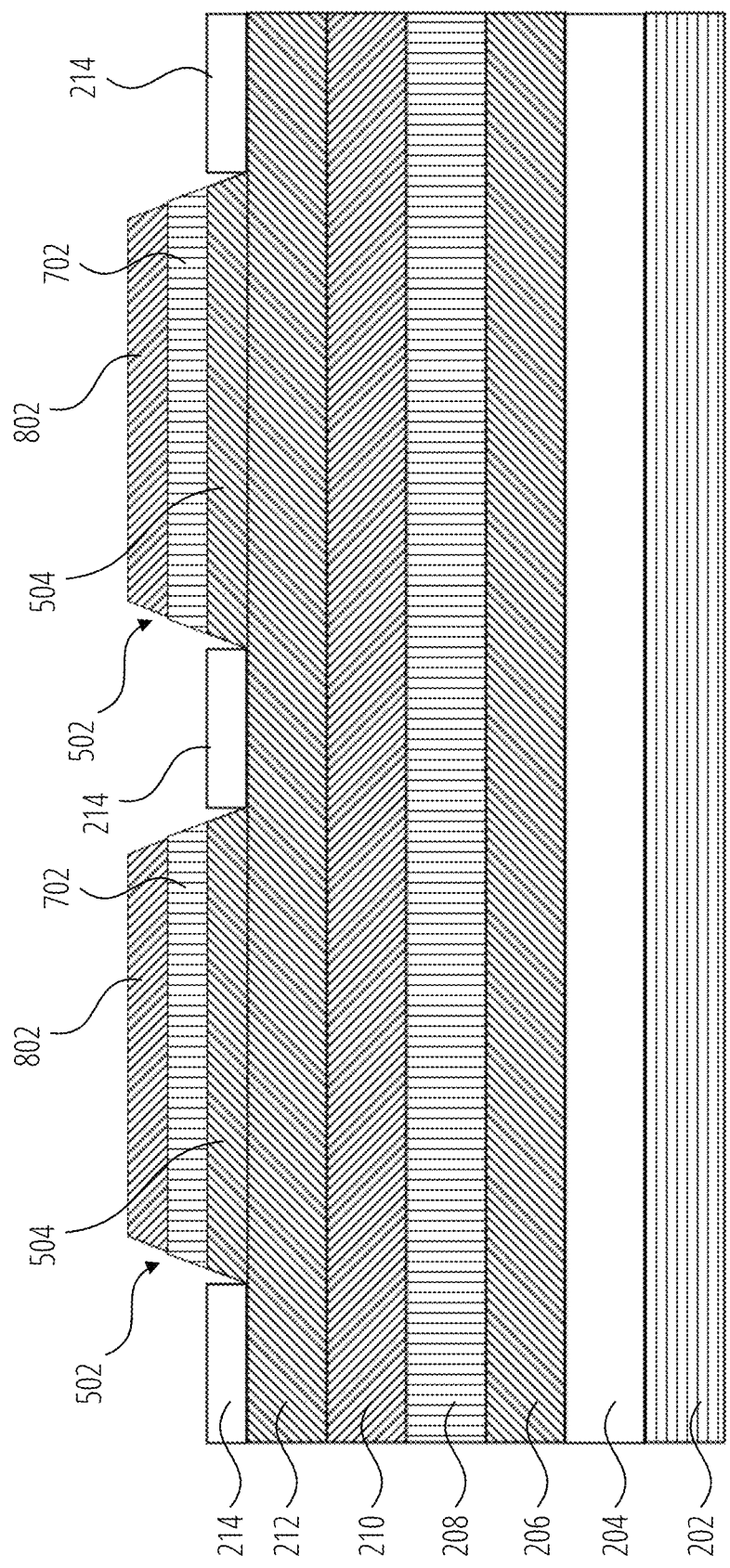
FIG. 8 illustrates a cross-sectional view of the semiconductor wafer template of FIG. 2 after a further LED pixel array fabrication operation, according to some examples.

FIG. 8 illustrates a cross-sectional view of the semiconductor wafer template 200 after operation 110. The mesa p-GaN layers 802 form a middle portion of each mesa 502. The sidewalls of each mesa 502 may continue to align with the semi-polar surface 606 of the GaN material of the mesa p-GaN layer 802, e.g., at a 62° angle to the surface of the upper n-GaN layer 212.

According to some examples, the method 100 includes forming an electrical contact above each mesa p-GaN layer 802 at operation 112. The electrical contact is a p-type electrical contact.

Figure 9:
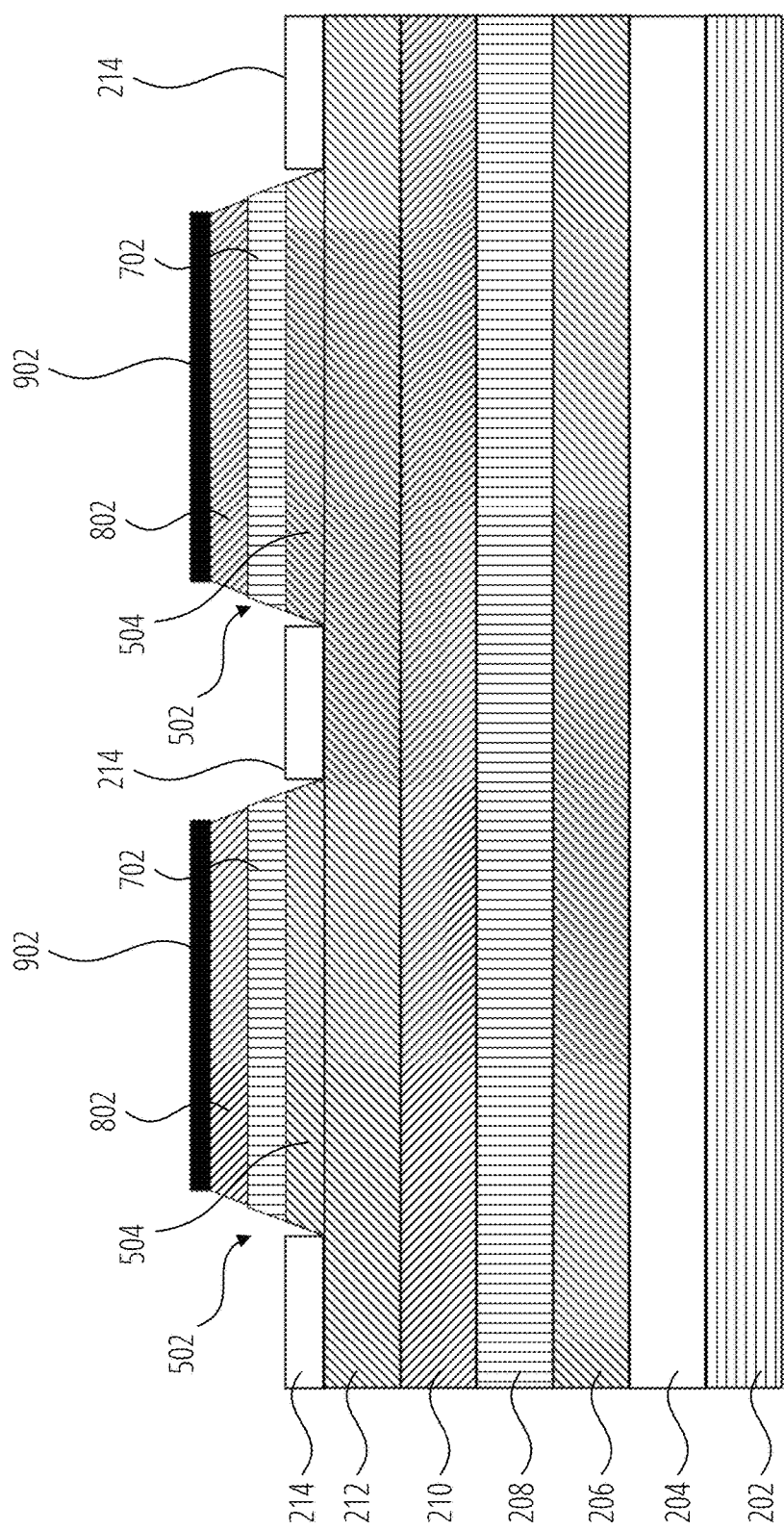
FIG. 9 illustrates a cross-sectional view of the semiconductor wafer template of FIG. 2 after a further LED pixel array fabrication operation, according to some examples.

FIG. 9 illustrates a cross-sectional view of the semiconductor wafer template 200 after operation 112. The p-type electrical contact is shown as p-contact 902. In some examples, the p-contact 902 may be formed from a suitable conductive material for forming an electrical contact on a p-GaN material, such as gold, a gold alloy, or a transparent conductive oxide, e.g., indium tin oxide (ITO).

According to some examples, the method 100 includes removing a portion of the dielectric layer 214 to expose a portion of the upper n-GaN layer 212 at operation 114. In some examples, the portion of the dielectric layer 214 may be removed through selective etching (e.g., wet etching) using photolithography.

Figure 10:
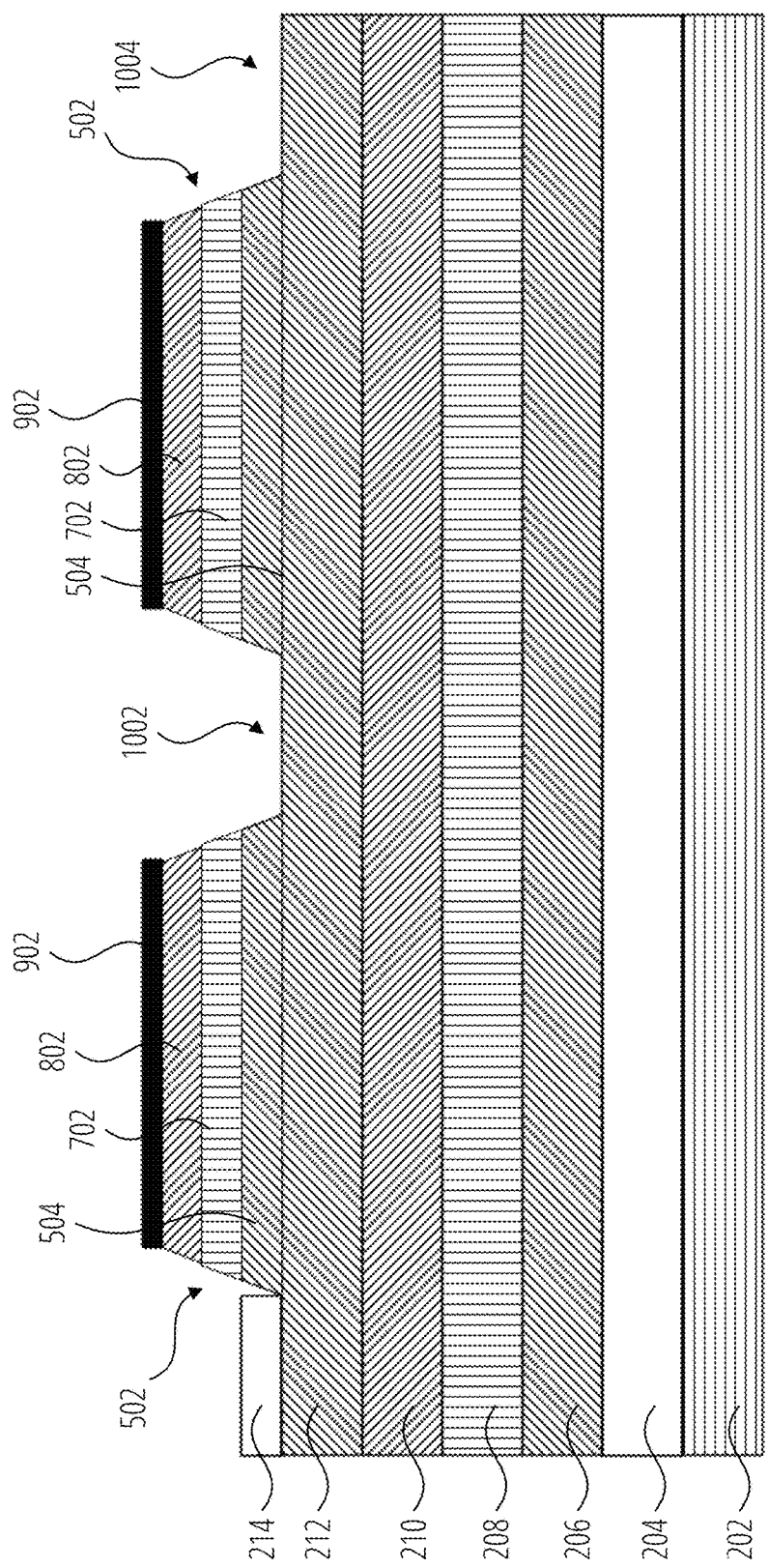
FIG. 10 illustrates a cross-sectional view of the semiconductor wafer template of FIG. 2 after a further LED pixel array fabrication operation, according to some examples.

FIG. 10 shows a cross-sectional view of the semiconductor wafer template 200 after operation 114. The dielectric layer 214 between the two mesas 502 has been removed to provide a first exposed portion 1002 of the upper n-GaN layer 212. The dielectric layer 214 to the right of the second mesa 502 has been removed to provide a second exposed portion 1004 of the upper n-GaN layer 212.

In some examples, only the first exposed portion 1002 is removed at a first iteration of operation 114. This is followed by deposition of an electrical contact 1204 at operation 118 (described below with reference to FIG. 12), which is masked (e.g., photolithographically masked) during a second iteration of operation 114 to selectively remove the second exposed portion 1004.

According to some examples, the method 100 includes etching through a portion of the dielectric layer 214, upper n-GaN layer 212, and lower MQW layer 208 to expose a portion of the lower n-GaN layer 206 at operation 116. As in operation 104 and operation 114, wet etching may be used to prevent damage to the exposed layers. In some examples, dry etching may be used instead of, or in addition to, wet etching, in order to maintain the straight edges of the etched apertures and the sizes of the apertures where they expose the layers below.

Figure 11:
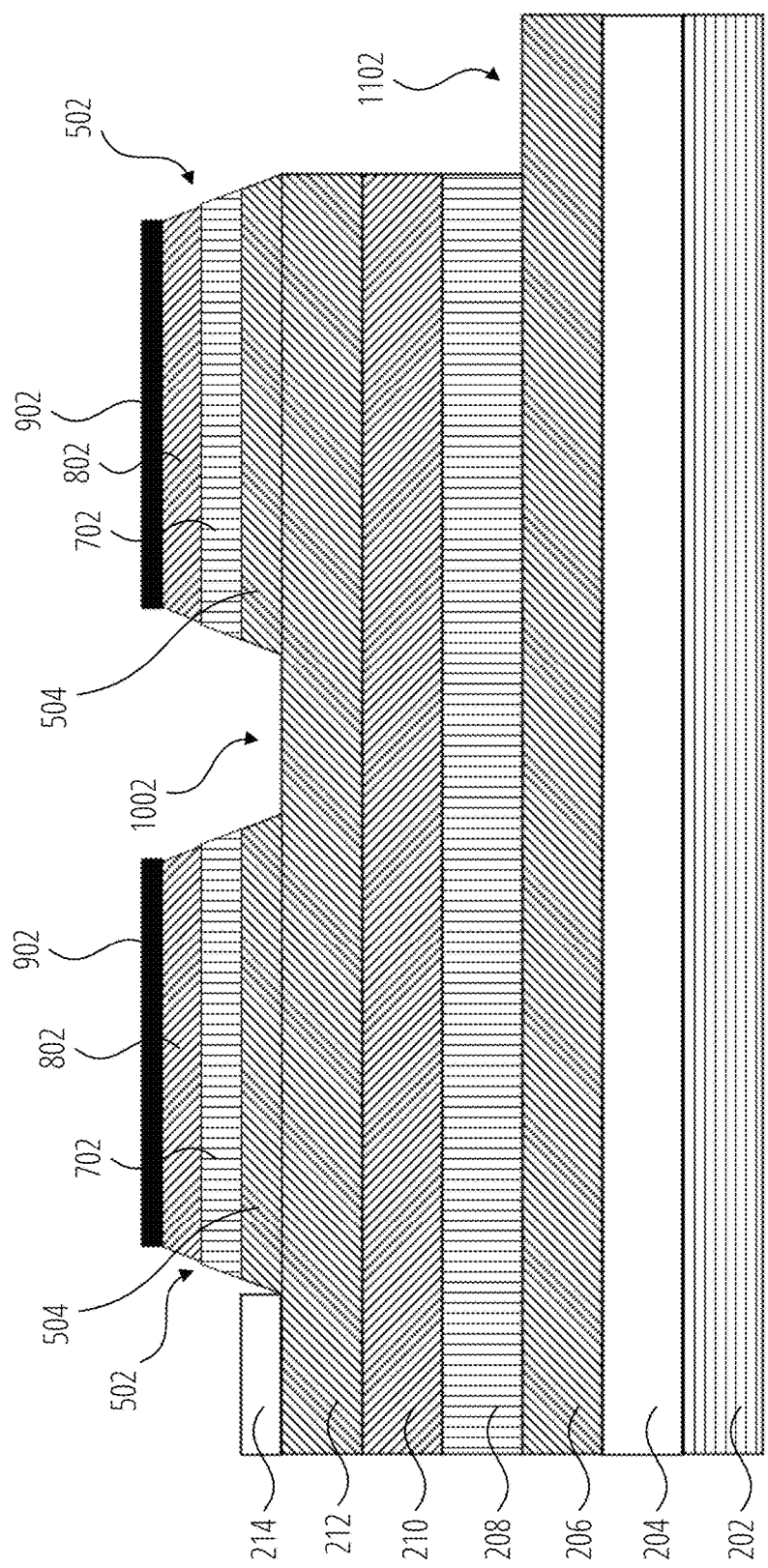
FIG. 11 illustrates a cross-sectional view of the semiconductor wafer template of FIG. 2 after a further LED pixel array fabrication operation, according to some examples.

FIG. 11 shows a cross-sectional view of the semiconductor wafer template 200 after operation 116. Wet etching may be used to etch through portions of the dielectric layer 214, upper n-GaN layer 212, and lower MQW layer 208 to the right side of the drawing, revealing an exposed portion 1102 of the lower n-GaN layer 206.

As described above, in some examples operation 116 is performed only after the electrical contact 1204 (described below with reference to FIG. 12) has been deposited over the first exposed portion 1002 of the upper n-GaN layer 212 and masked to protect the electrical contact 1204 against damage from the etching step of operation 116.

According to some examples, the method 100 includes forming an electrical contact 1204 on the exposed upper n-GaN layer 212 (e.g., on the first exposed portion 1002 of the upper n-GaN layer 212) at operation 118.

According to some examples, the method 100 includes forming an n-contact 1202 on the exposed portion of the lower n-GaN layer 206 (e.g., exposed portion 1102) at operation 120. The n-contact 1202 is an n-type electrical contact.

Figure 12:
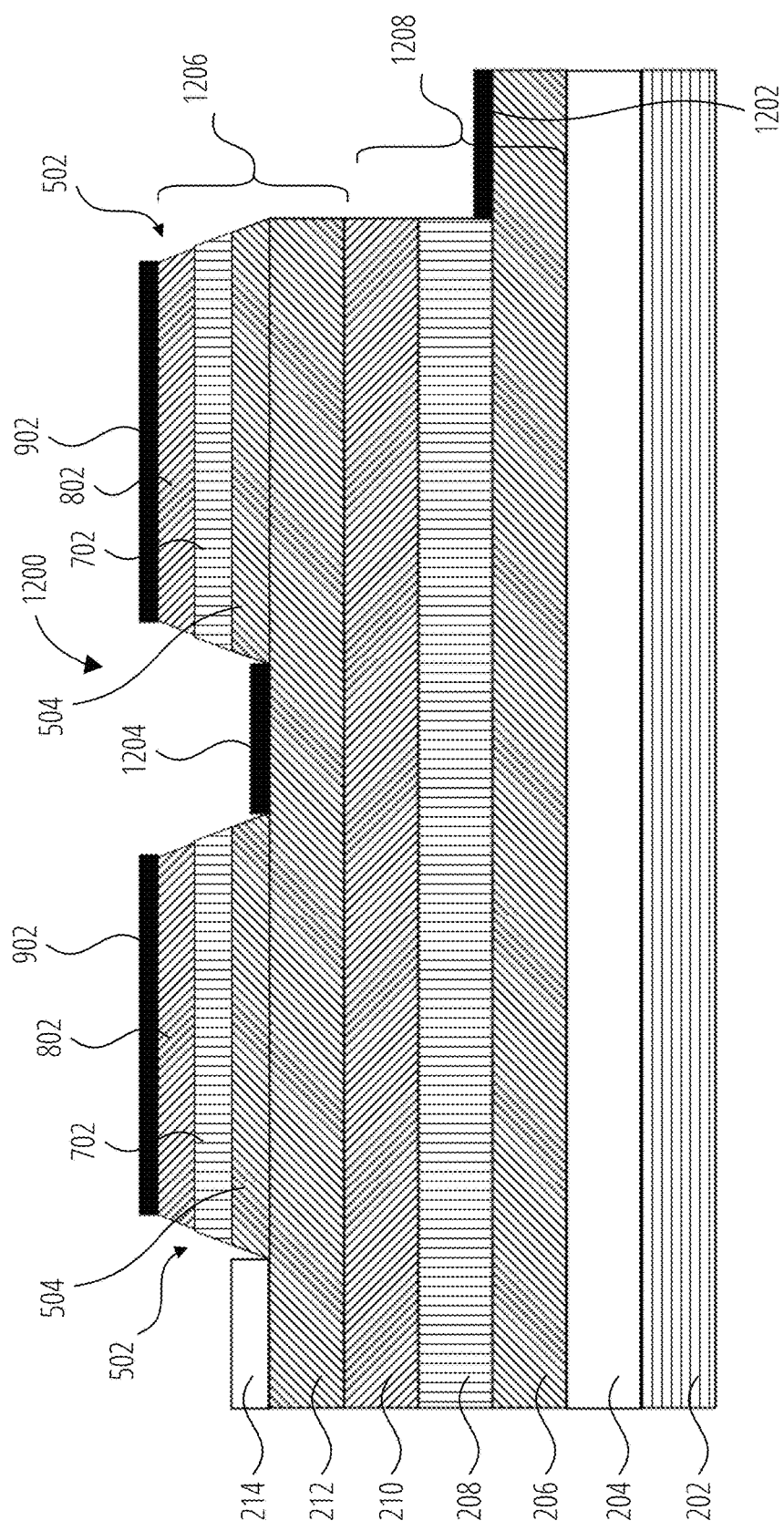
FIG. 12 illustrates a cross-sectional view of the semiconductor wafer template of FIG. 2 after a further LED pixel array fabrication operation to form a first example LED pixel structure, according to some examples.

FIG. 12 shows a cross-sectional view of the semiconductor wafer template of FIG. 2 after operation 118 and operation 120. An n-contact 1202 has been deposited on the exposed portion 1102 of the lower n-GaN layer 206. An electrical contact 1204 has been deposited on the first exposed portion 1002 of the upper n-GaN layer 212.

In the final pixel structure 1200, the mesa p-GaN layer 802 and mesa MQW layer 702 of each mesa LED form a respective mesa LED 1206 with the upper n-GaN layer 212, stimulated by the electrical contact 1204 (acting as an n-type electrical contact) and the mesa's p-contact 902. The lower n-GaN layer 206 and lower MQW layer 208 form a lower LED 1208 with the lower p-GaN layer 210, stimulated by the electrical contact 1204 (acting as a p-type electrical contact) and the n-contact 1202 formed on the lower n-GaN layer 206. Thus, in some examples, the electrical contact 1204 is configured to act as an n-type electrical contact for each mesa LED 1206, and a p-type electrical contact for the lower LED 1208.

In some examples, the n-contact 1202 and the electrical contact 1204 may both be formed from suitable conductive materials for forming an electrical contact on an n-GaN material, such as aluminum or an aluminum-containing compound or alloy.

Figure 13:
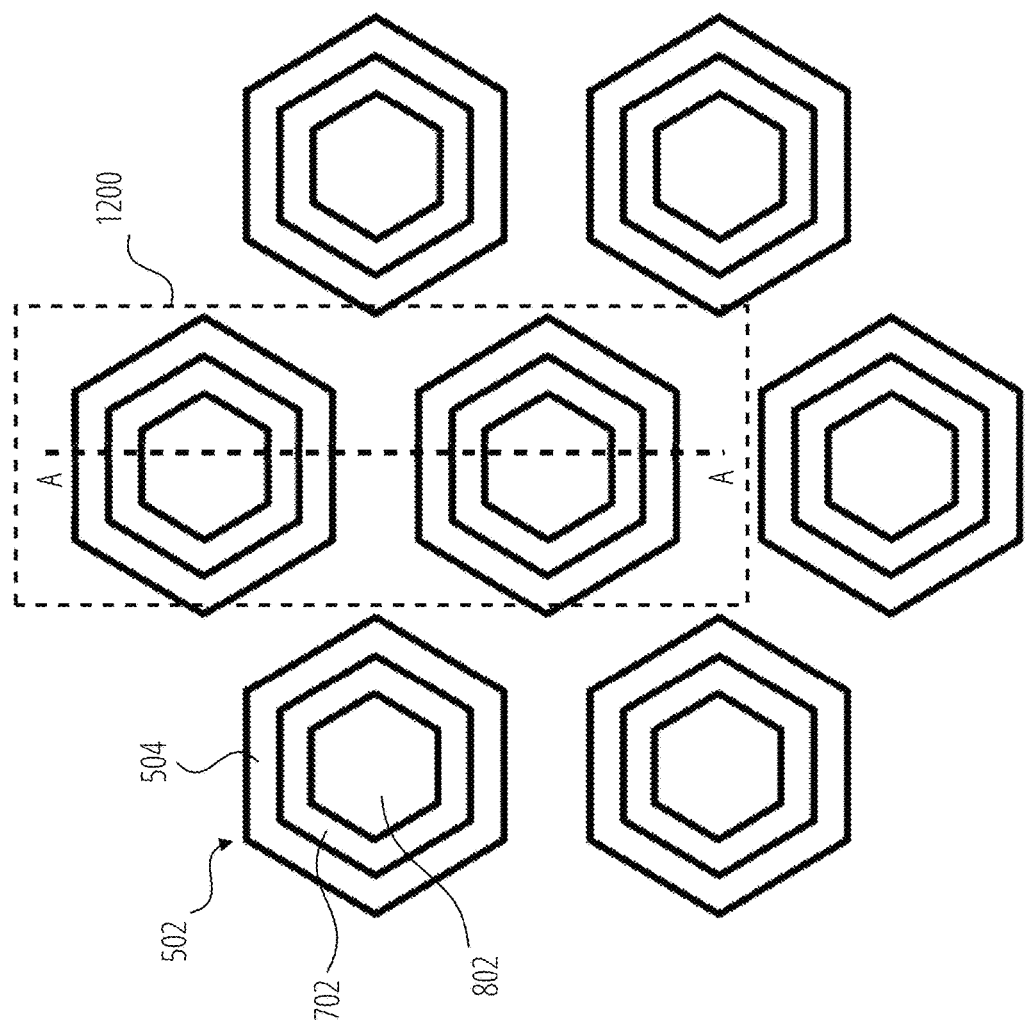
FIG. 13 illustrates an overhead view of an LED pixel structure according to FIG. 12, according to some examples.

FIG. 13 illustrates an overhead view of an LED pixel array including multiple tiled pixel structures 1200 of FIG. 12. The cross-sectional view of FIG. 12 can be regarded as being a view through cross-sectional line A-A shown in FIG. 13.

In the illustrated example LED pixel array layout, each mesa 502 has six sidewalls, defining a substantially hexagonal shape of each mesa 502. Each mesa p-GaN layer 802, mesa MQW layer 702, and mesa n-GaN layer 504 is hexagonal. The mesas 502 are laid out to form a honeycomb or hexagonal grid layout. Thus, a pair of mesas 502 may be regarded as forming a single pixel structure 1200, as shown in dashed outline.

It will be appreciated that the layout shown in FIG. 13 may constitute only a small portion of the entire LED pixel array, which may include hundreds, thousands, or millions of pixel structures 1200 in some examples.

In some examples, a different overhead shape may be used for the mesas 502, and/or the mesas 502 may be laid out in a different pattern. However, the hexagonal crystal structure 602 of the mesa p-GaN layer 802, mesa MQW layer 702, and mesa n-GaN layer 504 may facilitate the formation of mesas 502 having a hexagonal shape such as that illustrated in FIG. 13.

In some examples, the various structures shown and described herein have dimensions configured for the formation of microLED pixels. In a first example, the lower n-GaN layer 206 has a thickness of approximately between several hundred nanometers (nm) and a few (e.g., fewer than ten) microns (micrometers, μm). The lower MQW layer 208 has a thickness of approximately between 10 nm and several hundred nm. The lower p-GaN layer 210 has a thickness of approximately between 50 nm and several hundred nm. The height of the mesas depends on the total thickness of the MOCVD overgrowth, so the range of mesa height is approximately between 100 nm to a few (e.g., <10) microns. Mesa width and pixel pitch can be selected in accordance with a desired pixels per inch (PPI) specification for the pixel array; in various examples, the mesa width can be between tens of nm to several hundred microns.

CONCLUSION

LED pixel arrays, and methods for fabricating same, are described herein in reference to various examples.

Example 1 is a method of fabricating a light emitting diode (LED) pixel array from a semiconductor wafer template comprising a successively stacked lower n-type gallium nitride (n-GaN) layer, lower multiple quantum well (MQW) layer, lower p-type gallium nitride (p-GaN) layer, upper n-GaN layer, and dielectric layer, the method comprising: forming a plurality of apertures through the dielectric layer and extending to the upper n-GaN layer; and forming a plurality of mesas by forming, within each aperture: a mesa n-GaN layer; a mesa MQW layer above each mesa n-GaN layer; and a mesa p-GaN layer above each mesa MQW layer, such that: the mesa n-GaN layer, mesa MQW layer, and mesa p-GaN layer of each mesa form a respective mesa LED; and the lower n-GaN layer, lower MQW layer, and lower p-GaN layer form a lower LED.

In Example 2, the subject matter of Example 1 includes, removing a portion of the dielectric layer to expose a portion of the upper n-GaN layer; and forming an electrical contact on the exposed portion of the upper n-GaN layer, wherein the electrical contact is configured to act as: an n-type electrical contact for the mesa LED; and a p-type electrical contact for the lower LED.

In Example 3, the subject matter of Example 2 includes, wherein: the electrical contact comprises aluminum.

In Example 4, the subject matter of Examples 1-3 includes, etching through the dielectric layer, upper n-GaN layer, and lower MQW layer to expose a portion of the lower n-GaN layer; and forming an n-type electrical contact on the exposed portion of the lower n-GaN layer.

In Example 5, the subject matter of Example 4 includes, wherein: the n-type electrical contact comprises aluminum.

In Example 6, the subject matter of Examples 1-5 includes, forming a p-type electrical contact on the mesa p-GaN layer of each mesa.

In Example 7, the subject matter of Example 6 includes, wherein: the p-type electrical contact comprises a transparent conductive oxide.

In Example 8, the subject matter of Examples 1-7 includes, forming a p-type electrical contact on the mesa p-GaN layer of each mesa; masking the p-type electrical contacts; removing a portion of the dielectric layer to expose a portion of the upper n-GaN layer; forming an electrical contact on the exposed portion of the upper n-GaN layer; etching through the dielectric layer, upper n-GaN layer, and lower MQW layer to expose a portion of the lower n-GaN layer; and forming an n-type electrical contact on the exposed portion of the lower n-GaN layer, wherein the electrical contact is configured to act as: an n-type electrical contact for the mesa LED; and a p-type electrical contact for the lower LED.

In Example 9, the subject matter of Examples 1-8 includes, wherein: each mesa has sidewalls formed at an angle defined by a semi-polar surface of a crystal structure of the mesa n-GaN layer, mesa MQW layer, and mesa p-GaN layer.

In Example 10, the subject matter of Examples 1-9 includes, wherein: the lower LED is a blue LED.

In Example 11, the subject matter of Example 10 includes, wherein: each mesa LED is a tunable red/green LED.

In Example 12, the subject matter of Examples 10-11 includes, the mesa LEDs includes at least one red LED and at least one green LED.

In Example 13, the subject matter of Examples 1-12 includes, wherein: the lower LED is a tunable blue/green LED; and each mesa LED is a red LED.

In Example 14, the subject matter of Examples 1-13 includes, wherein: the semiconductor wafer template further comprises, under the lower n-GaN layer, a successively stacked substrate layer and undoped gallium nitride (u-GaN) layer.

In Example 15, the subject matter of Example 14 includes, forming the semiconductor wafer template by: epitaxially forming the u-GaN layer on the substrate layer; epitaxially forming the lower n-GaN layer on the u-GaN layer; epitaxially forming the lower MQW layer above the lower n-GaN layer; epitaxially forming the lower p-GaN layer above the lower MQW layer; cleaning an upper surface of the lower p-GaN layer to remove p-type dopants; forming a tunnel junction above the lower p-GaN layer; epitaxially forming the upper n-GaN layer above the tunnel junction; and epitaxially forming the dielectric layer above the upper n-GaN layer.

In Example 16, the subject matter of Examples 1-15 includes, wherein: each mesa has six sidewalls, defining a substantially hexagonal shape of each mesa.

Example 17 is a pixel array formed in accordance with the method of Example 1.

Example 18 is a light emitting diode (LED) pixel array, comprising a plurality of LED pixel structures, each LED pixel structure comprising: a lower LED comprising a successively stacked lower n-GaN layer, lower MQW layer, and lower p-GaN layer; and a plurality of mesas formed above the lower p-GaN layer, each mesa defining a respective mesa LED comprising a mesa n-GaN layer, a mesa MQW layer, and a mesa p-GaN layer.

In Example 19, the subject matter of Example 18 includes, wherein: the lower LED is a tunable blue/green LED; and each mesa LED is a red LED.

In Example 20, the subject matter of Examples 18-19 includes, wherein: the lower LED is a blue LED; and each mesa LED is a tunable red/green LED.

Example 21 is at least one machine-readable medium including instructions that, when executed by processing circuitry, cause the processing circuitry to perform operations to implement of any of Examples 1-20.

Example 22 is an apparatus comprising means to implement any of Examples 1-20.

Example 23 is a system to implement any of Examples 1-20.

Example 24 is a method to implement any of Examples 1-20.

Other technical features and/or benefits may be readily apparent to one skilled in the art from the figures, descriptions, and claims herein.

What is claimed is:

1. A method of fabricating a light emitting diode (LED) pixel array from a semiconductor wafer template comprising a successively stacked lower n-type gallium nitride (n-GaN) layer, lower multiple quantum well (MQW) layer, lower p-type gallium nitride (p-GaN) layer, upper n-GaN layer, and dielectric layer, the method comprising:
   forming a plurality of apertures through the dielectric layer and extending to the upper n-GaN layer; and
   forming a plurality of mesas by forming, within each aperture:
   a mesa n-GaN layer;
   a mesa MQW layer above each mesa n-GaN layer; and
   a mesa p-GaN layer above each mesa MQW layer, such that:
   the mesa n-GaN layer, mesa MQW layer, and mesa p-GaN layer of each mesa form a respective mesa LED; and
   the lower n-GaN layer, lower MQW layer, and lower p-GaN layer form a lower LED.

2. The method of claim 1, further comprising:
   removing a portion of the dielectric layer to expose a portion of the upper n-GaN layer; and
   forming an electrical contact on the exposed portion of the upper n-GaN layer, wherein the electrical contact is configured to act as:
   an n-type electrical contact for the mesa LED; and a p-type electrical contact for the lower LED.

3. The method of claim 2, wherein:
the electrical contact comprises aluminum.

4. The method of claim 1, further comprising:
etching through the dielectric layer, upper n-GaN layer, and lower MQW layer to expose a portion of the lower n-GaN layer; and
forming an n-type electrical contact on the exposed portion of the lower n-GaN layer.

5. The method of claim 4, wherein:
the n-type electrical contact comprises aluminum.

6. The method of claim 1, further comprising:
forming a p-type electrical contact on the mesa p-GaN layer of each mesa.

7. The method of claim 6, wherein:
the p-type electrical contact comprises a transparent conductive oxide.

8. The method of claim 1, further comprising:
forming a p-type electrical contact on the mesa p-GaN layer of each mesa;
masking the p-type electrical contacts;
removing a portion of the dielectric layer to expose a portion of the upper n-GaN layer;
forming an electrical contact on the exposed portion of the upper n-GaN layer;
etching through the dielectric layer, upper n-GaN layer, and lower MQW layer to expose a portion of the lower n-GaN layer; and
forming an n-type electrical contact on the exposed portion of the lower n-GaN layer, wherein the electrical contact is configured to act as:
an n-type electrical contact for the mesa LED; and
a p-type electrical contact for the lower LED.

9. The method of claim 1, wherein:
each mesa has sidewalls formed at an angle defined by a semi-polar surface of a crystal structure of the mesa n-GaN layer, mesa MQW layer, and mesa p-GaN layer.

10. The method of claim 1, wherein:
the lower LED is a blue LED.

11. The method of claim 10, wherein:
each mesa LED is a tunable red/green LED.

12. The method of claim 10, wherein:
the mesa LEDs comprise at least one red LED and at least one green LED.

13. The method of claim 1, wherein:
the lower LED is a tunable blue/green LED; and
each mesa LED is a red LED.

14. The method of claim 1, wherein:
the semiconductor wafer template further comprises, under the lower n-GaN layer, a successively stacked substrate layer and undoped gallium nitride (u-GaN) layer.

15. The method of claim 14, further comprising forming the semiconductor wafer template by:
epitaxially forming the u-GaN layer on the substrate layer;
epitaxially forming the lower n-GaN layer on the u-GaN layer;
epitaxially forming the lower MQW layer above the lower n-GaN layer;
epitaxially forming the lower p-GaN layer above the lower MQW layer;
cleaning an upper surface of the lower p-GaN layer to remove p-type dopants;
forming a tunnel junction above the lower p-GaN layer;
epitaxially forming the upper n-GaN layer above the tunnel junction; and
epitaxially forming the dielectric layer above the upper n-GaN layer.

16. The method of claim 1, wherein:
each mesa has six sidewalls, defining a substantially hexagonal shape of each mesa.

\* \* \* \* \*

UNITED STATES PATENT AND TRADEMARK OFFICE
CERTIFICATE OF CORRECTION

| | | |
|---|---|---|
| PATENT NO. | : 12,446,385 B2 | Page 1 of 1 |
| APPLICATION NO. | : 18/924840 | |
| DATED | : October 14, 2025 | |
| INVENTOR(S) | : Feng et al. | |

It is certified that error appears in the above-identified patent and that said Letters Patent is hereby corrected as shown below:

In the Claims

In Column 10, Line 54, in Claim 1, after "layer,", insert a linebreak

In Column 10, Line 65, in Claim 2, after "layer,", insert a linebreak

In Column 11, Line 30, in Claim 8, after "layer,", insert a linebreak

Signed and Sealed this
Sixteenth Day of December, 2025

John A. Squires
*Director of the United States Patent and Trademark Office*